United States Patent
Choi et al.

(10) Patent No.: US 7,321,345 B2
(45) Date of Patent: Jan. 22, 2008

(54) PLASMA DISPLAY PANEL MODULE

(75) Inventors: Jeong Pil Choi, Suwon-si (KR); Geun Soo Lim, Seongnam-si (KR)

(73) Assignee: LG Electronics Inc., Seoul (KR)

( * ) Notice: Subject to any disclaimer, the term of this patent is extended or adjusted under 35 U.S.C. 154(b) by 609 days.

(21) Appl. No.: 10/849,874

(22) Filed: May 21, 2004

(65) Prior Publication Data

US 2004/0233132 A1    Nov. 25, 2004

(30) Foreign Application Priority Data

May 23, 2003    (KR)    ............... 10-2003-0033073

(51) Int. Cl.
*G09G 3/28* (2006.01)
(52) U.S. Cl. ............ 345/60; 345/62; 313/583; 315/169.4
(58) Field of Classification Search ............ 345/60–69, 345/101; 315/169.1–169.4; 313/583
See application file for complete search history.

(56) References Cited

U.S. PATENT DOCUMENTS

| 6,621,234 B2 * | 9/2003 | Itoh et al. ............... 315/169.4 |
| 6,847,415 B1 * | 1/2005 | Yoshimura et al. ........... 349/58 |
| 7,091,665 B2 * | 8/2006 | Nomoto et al. ............. 313/583 |

* cited by examiner

*Primary Examiner*—Amr A. Awad
*Assistant Examiner*—Yong Sim
(74) *Attorney, Agent, or Firm*—Ked & Associates, LLP

(57) ABSTRACT

The present invention relates to the plasma display panel module that integrates a sustainer board and reduces electromagnetic interference. The plasma display panel module includes a plasma display panel that includes scan electrode lines, sustain electrode lines, and a data electrode lines, an integration driving board that drives scan electrode lines and sustain electrode lines, a first electric current path that is connected between the integration driving board and the scan electrode lines, a second electric current path that is connected between the integration driving board and the sustain electrode lines, and a metal plate to release heat by a plasma display panel, which a penetration hole that the second electric current path penetrates is formed.

18 Claims, 6 Drawing Sheets

PLASMA DISPLAY PANEL MODULE

This Nonprofessional application claims priority under 35 U.S.C. § 119(a) on Patent Application No. 10-2003-033073 filed in Korea on May 23, 2003, the entire contents of which are hereby incorporated by reference.

BACKGROUND OF THE INVENTION

1. Field of the Invention

The present invention relates to a plasma display panel module, and more specifically, a plasma display panel module with a sustainer board.

2. Description of the Background Art

Recently, a plasma display panel (hereinafter, referred to as "PDP") with easiness of producing a larger size panel has received attention as a plate display device. A PDP usually displays images by adjusting a gas discharge period of each pixel by digital video data. A typical example of the PDP is an alternating current PDP with three electrodes that is driven by alternating current, as is shown in FIG. 1.

FIG. 1 is an enlarged view of a discharge cell that comprises an alternating current PDP known in the prior art.

A discharge cell 30 illustrated in FIG. 1 has an upper plate that includes an upper substrate 10, sustain electrodes 12A and 12B that are formed on the upper substrate 10 in order, an upper dielectric layer 14, and a protective film 16, and an lower plate that includes a lower substrate 18, a data electrode 20 that is formed on the lower substrate 18 in order, a lower dielectric layer 22, a division wall 24, and a phosphor layer 26.

The sustain electrodes 12A and 12B includes a scan electrode 12A and a sustain electrode 12B. Each of the sustain electrodes 12A and 12B is comprised of a transparent electrode and a metal electrode that decrease high resistance by the transparent electrode.

The scan electrode 12A provides a scan signal for an address discharge and a sustain signal for a sustain discharge, and the sustain electrode 12B provides a sustain signal. The data electrode 20 is formed so that the electrode intersects with the sustain electrodes 12A and 12B. The data electrode 20 provides a data signal for the address discharge.

Electrical charges that is generated by a discharge are accumulated in the upper dielectric layer 14 and the lower dielectric layer 22. The protective film 16 prevents the upper dielectric layer 14 from damaging by sputtering in the discharge, and increases the discharge efficiency of secondary electrons. It is possible to decrease the discharge voltage externally applied by the upper dielectric layer 14, the lower dielectric layer 22, and the protective film 16.

The division wall 24 forms a discharge space with the upper substrate 10 and the lower substrate 18. The division wall 24 is formed in parallel to the data electrode 20, and prevents ultraviolet rays generated by the gas discharge from leaking into adjacent cells.

The surface of the lower dielectric layer 22 and the division wall 24 is covered by the phosphor layer 26, and the phosphor layer 26 generates red, green, or blue visible ray. Inert gases for the gas discharge, such as helium (He), neon (Ne), argon (Ar), xenon (Xe), or Kripton (Kr), mixed discharge gases by those inert gases, or excimer gases that can generate ultraviolet rays by the discharge, are charged in the discharge space.

The discharge cell 30 with this structure maintains the discharge by generating the surface discharge between the sustain electrodes 12A and 12B, after it is selected in the opposite discharge between the data electrode 20 and the scan electrode 12A. Due to this, in the discharge cell 30, the phosphor layer 26 emits light because of ultraviolet rays generated in the sustain discharge, and thereafter visible rays are released.

The gradation display of a PDP is comprised of a process of adjusting the sustain discharge period in the discharge cell 30 by video data, that is, adjusting the number of the sustain discharge. Then, color of a pixel is displayed by combination of three discharge cells that red, green, and blue phosphor layers 26 are applied.

FIG. 2 is a diagram illustrating the whole alignment of electrodes in a PDP and includes the discharge cell 30 illustrated in FIG. 1. In FIG. 2, the discharge cell 30 locates in each of the intersections of scan electrode lines Y1 through Ym, sustain electrode lines Z1 through Zm, and data electrode lines X1 through Xn.

The scan electrode lines Y1 through Ym provide a scan pulse and a sustain pulse so that the discharge cell 30 is scanned by the line, and maintain the discharge in the discharge cell 30. The sustain electrode lines Z1 through Zm provide a common sustain pulse, and maintain the discharge in the discharge cell 30 with the scan electrode lines Y1 through Ym. Data electrode lines X1 through Xn provide a data pulse synchronized with the scan pulse by the line, so that the discharge cell 30 that the discharge is maintained by the theoretical value of the data pulse is selected.

A typical example of this PDP driving method is an address and display separation (hereinafter, referred to as "ADS") driving method. In the method, the address period and the display period (in other words, the sustain period) are separated.

In the ADS driving method, one frame is divided into sub-fields corresponding to video data, and each of the sub-fields is redivided into the reset period, the address period, and the sustain period. Each of the sub-fields includes the same reset period RPD and the same address period APD, and also includes the sustain period SPD that different weighted values are assigned. Due to this, the PDP display gradation corresponding to the video data is displayed by the combination of sustain periods that maintain the discharge with the video data.

FIG. 3 is a common driving waveform that is provided for the PDP illustrated in FIG. 2 in a sub-field 1 SF of some sub-fields.

The PDP equalizes all of the wall charges in the discharge cell 30 by erasing a certain amount of the wall charges, after it generates the full lighting discharge that uses a reset pulse RP in the reset period RPD as shown in FIG. 3.

Because of this, the reset pulse RP is provided with the scan electrode lines Y1 through Ym. The reset pulse RP is composed of a ramp-up pulse and a ramp-down pulse. The ramp-up pulse gradually increases to the peak voltage Vr on the basis of the step voltage Vs, and the ramp-down pulse gradually decrease to the base voltage 0V.

The ramp-up pulse generates the first dark discharge in all the discharge cells 30. Then, the ramp-down pulse and a bias pulse BP that is provided with the sustain electrodes Zi through Zm generates the second dark discharge in all the discharge cells 30.

The ramp-down pulse decreases wall discharges generated in the scan electrode lines Y1 through Ym and the sustain electrode lines Z1 through Zm to a certain amount, and this equally initializes wall charges in all of the discharge cells 30. In the reset period RPD, the voltage of data electrode lines X1 through Xn is fixed at the base voltage 0V.

In the address period APD, the scan pulse SP is provided with the scan electrode lines Y1 though Ym by the line, and the data pulse DP is selectively provided with each of the data electrode lines X1 through Xn in synchronization with the scan pulse SP.

Due to this, the address discharge is generated in the discharge cells that the scan pulse SP and the data pulse DP are provided, and this generates sufficient amount of wall charges for the next sustain discharge. On the other hand, the address discharge is not generated in the discharge cells that the scan pulse SP and the data pulse DP are not provided, and this maintains the off-state.

In the sustain period SPD, a sustain pulse SUSPy and a sustain pulse SUSPz are alternately provided with the scan electrode lines Y1 through Ym and the sustain electrode lines Z1 through Zm, and the state of discharge cells that is decided in the address period APD is maintained.

In the concrete, the discharge cells, which sufficient amount of wall discharges is formed in the address period APD, maintain the on-state of the discharge by the sustain pulse SUSPy and the sustain pulse SUSPz, and the discharge cells in the off-state maintain the off-state without any discharge.

In the erase period EPD that follows the sustain period SPD, an erase pulse EP is provided for the sustain electrode lines Zi through Zm and the erase discharge is generated, and this erases wall discharges in all of the discharge cells 30.

To provide the driving waveform with the PDP shown in FIG. 2, a driving device is installed on the back of a heat sink 64, which is located on the backside of a PDP 40 as is shown in FIGS. 4 and 5.

The driving device shown in FIGS. 4 and 5 has a driving board Y 45, a sustainer board Z 48, a data driver board 50, a control board 42, and a power board that is not shown in the diagrams.

The driving board Y 45 drives the scan electrode lines Y1 through Ym in the PDP 40, and the sustainer board Z 48 drives the sustain electrode lines Z1 through Zm. The data driver board 50 drives the data electrode liens X1 through Xm, and the control board 42 controls the driving board Y 45, the sustainer board Z 48, and the data driver board 50. The power board that is not shown in the diagrams supplies power with the control board 42, the driving board Y 45, the sustainer board Z 48, and the data driver board 50.

The driving board Y 45 includes a scan driver board 44 and a sustainer board Y 46. The scan driver board 44 generates the reset pulse RP and the scan pulse SP, which are shown in FIG. 3 of PDP 40. The sustainer board Y 46 generates the sustain pulse Y SUSPy.

The scan driver board 44 provides the scan pulse SP with the scan electrode lines Y1 through Ym in the PDP 40 via a flexible printed circuit (hereinafter, referred to as "FPC") 51. The sustainer board Y 46 provides the sustain pulse Y SUSPy with the scan electrode lines Y1 through Ym via the scan driver board 44 and a FPC Y 51.

The sustainer board Z 48 generates the bias pulse BP and the sustain pulse Z SUSz, which are shown in FIG. 3, and provides them with the sustain electrode lines Z1 through Zm in the PDP 40 via a FPC Z 52.

The data driver board 50 generates the data pulse DP shown in FIG. 3, and provides this to the data electrode lines X1 through Xn in the PDP 40 via a FPC X 54.

The control board 42 generates each of the timing control signals X, Y, and Z. The control board 42 provides a timing control signal Y with the driving board Y 45 via a first FPC 56, provides a timing control signal Z with the sustainer board Z 48 via a second FPC 58, and provides a timing control signal Z with the data driver board 50 via a third FPC 60.

In case of driving a PDP module with this structure, a electric current path in the sustain period SPD is as follows. Firstly, when sustain pulse Y SUSPy is provided with the scan electrode lines Y1 through Ym from the driving board Y 45, the first electric current path follows the direction of: the driving board Y 45, the scan electrode lines Y1 through Ym, a panel capacitor, the sustain electrode lines Z1 through Zm, the sustainer board Z 48, the heat sink 64, and the driving board Y 45.

Also, when the sustain pulse Z SUSPz is provided with the sustain electrode lines Z1 through Zm from the sustainer board Z 48, the second electric current path follows the direction of: the sustainer board Z 48, the sustain electrode lines Z1 through Zm, the panel capacitor, the scan electrode lines Y1 through Ym, the driving board Y 45, the heat sink 64, and the sustainer board Z 48.

SUMMARY OF THE INVENTION

Accordingly, an object of the present invention is to solve at least the problems and disadvantages of the background art.

The objective of the present invention is to integrate sustainer boards and provide a PDP module that decreases the electromagnetic interference.

The PDP module in the embodiment of the present invention is comprised of a plasma display panel that has scan electrode lines, sustain electrode lines, and data electrode lines, an integration driving board that drives the scan electrode lines and the sustain electrode lines, a first electrode path that is connected between an integration driving board and a scan electrode line, a second electrode path that is connected between the integration driving board and a sustain electrode line, and a metal plate to release heat from the PDP, which a penetration hole that the second electric current path penetrates is formed.

BRIEF DESCRIPTION OF THE DRAWINGS

The invention will be described in detail with reference to the following drawings in which like numerals refer to like elements.

DETAILED DESCRIPTION OF PREFERRED EMBODIMENTS

Figure 1:
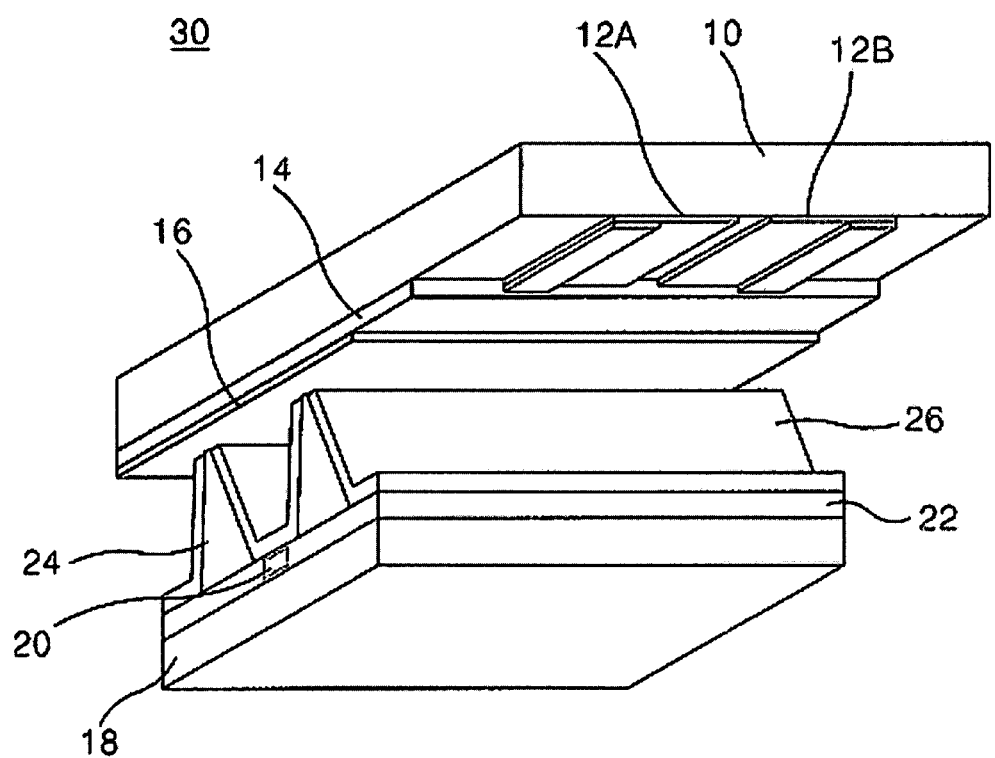
FIG. 1 is an oblique perspective diagram illustrating a discharge cell in a common three electrodes alternate current type plasma display panel.
Figure 2:
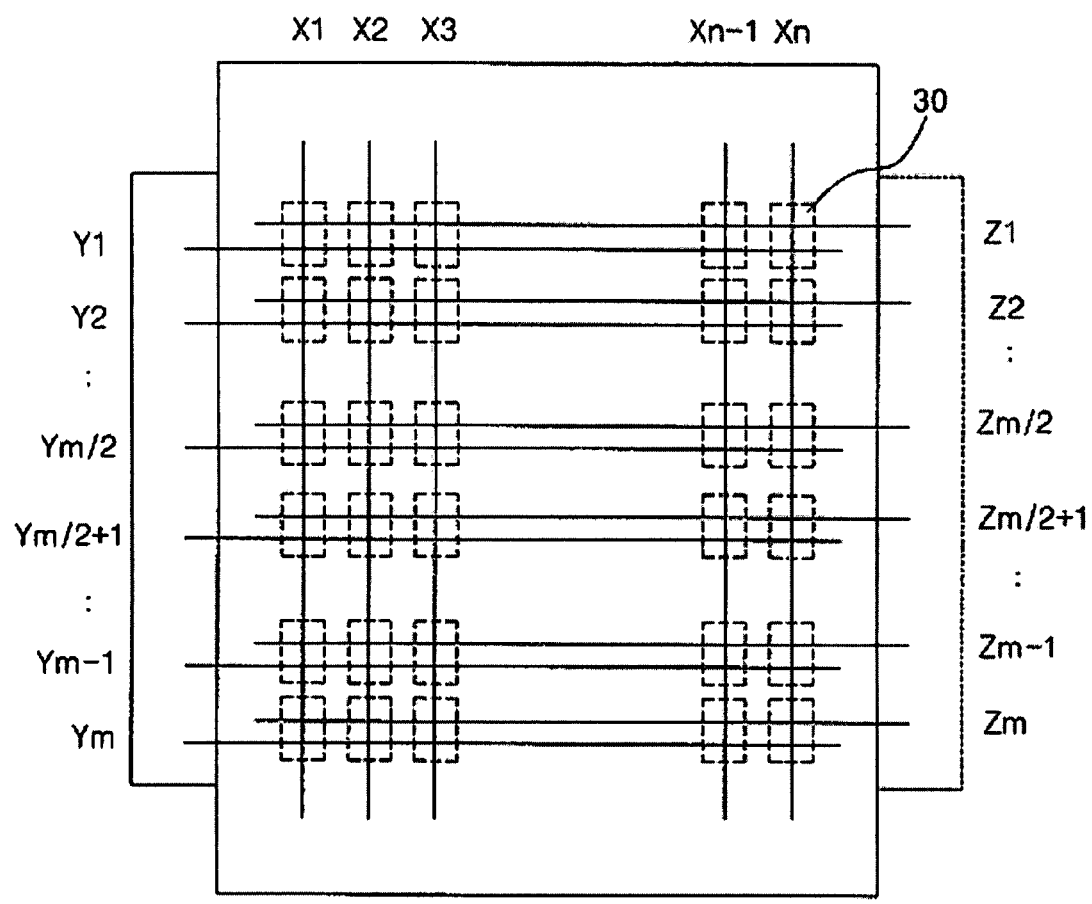
FIG. 2 is a diagram illustrating a whole alignment of electrodes in a common plasma display.

In the PDP module of the embodiment of the present invention, the second electric current path is connected to the integration driving board and is connected to the sustain electrode line via a path between the PDP and the metal plate through the penetration hole.

In the PDP module in the embodiment of the present invention, the penetration hole is formed adjacent to the integration driving board.

In the PDP module in the embodiment of the present invention, the first and second electric current paths are respectively a first FPC and a second FPC.

In the PDP module of the embodiment of the present invention, the first electric current path is connected to either the face or the back of a side of the integration driving board.

In the PDP module of the embodiment of the present invention, the second electric current path is connected to either the face or the back of the other side of the integration driving board.

In the PDP module of the embodiment of the present invention, the integration driving board has a scan driver board that generates a scan pulse provided with the scan electrode lines, an integration sustainer board that generates the first sustain pulse provided with the scan electrode line and a second sustain pulse provided with the sustain electrode lines, and a connector that connects the scan driver board to the integration sustainer board.

The PDP module of the embodiment of the present invention further includes a data driver board that generates a data pulse provided with the data electrode line, a FPC that is connected between the data driver board and the data electrode line, a control board that provides a control signal with upper board 90 in parallel, and the data electrode lines X1 through Xn are formed on the lower board 92.

Also, a pad region Y 94 is formed on a side of the upper board 90, and a pad Y (not shown in the diagram) that is connected to the scan electrode lines is formed in this region. On the other hand, a pad region Z 96 is formed on the other side of the upper board 90, and a pad Z (not shown in the diagram) that is connected to the sustain electrode lines (not shown in the diagram) is formed in this region.

And, a pad region X is formed on a side of the lower board 92, and a pad X (not shown in the diagram) that is connected to a data line is formed in this region. The upper board 90 and lower board 92 are attached so that the pad region Y 94, the pad region Z 96, and pad region X (not shown in the diagram) can be exposed.

The heat sink 86 is installed in the place where whole the heat sink overlaps with the back of the PDP 70, so that the heat sink can easily release heat generated in the PDP 70. Also, a penetrating hole 85 is formed in the heat sink 86. A FPC Z 84 can penetrate the heat sink 86 through the hole, and can electrically connect a sustain circuit Z (not shown in the diagram) in a Y-Z sustainer board 74 and a pad region Z 96 that is formed on the upper board 90. The penetrating hole 85 is formed adjacent to the Y-Z sustainer board 74.

The control board 72 generates each of timing control signals X, Y, and Z. The control board 72 provides the timing control signals Y and Z with a Y-Z integration board 100 via a first FPC 76, and provides the timing control signal X with the data driver board 80 via a second FPC 78.

Figure 3:
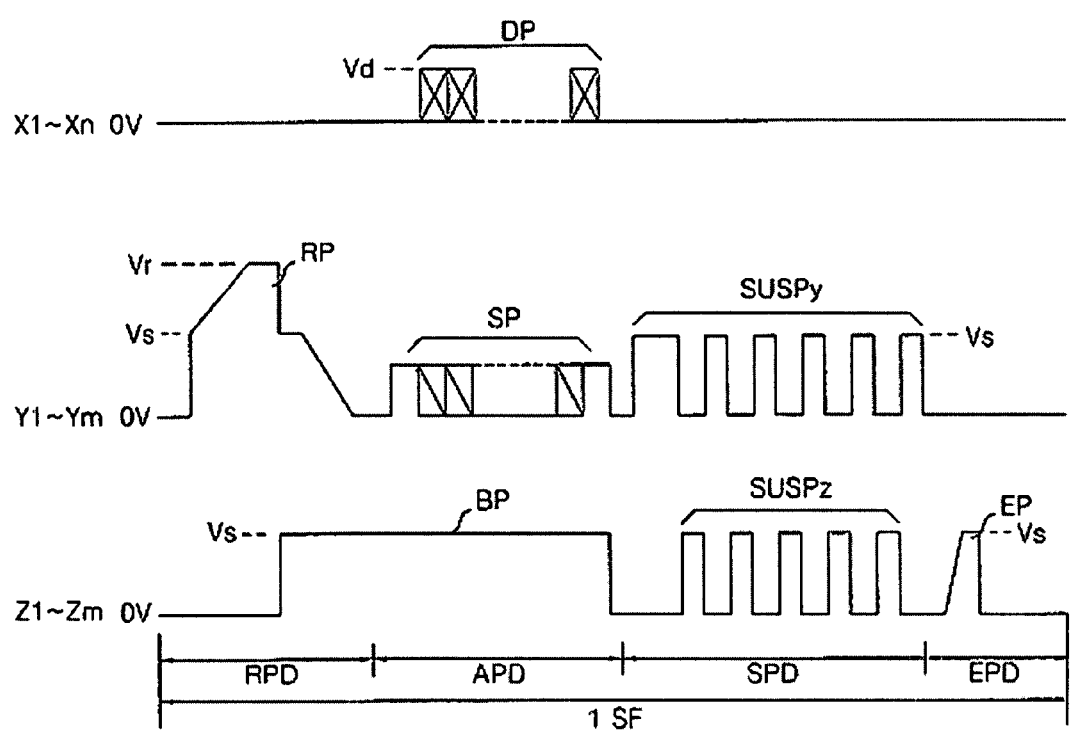
FIG. 3 is a driving waveform by plasma display panel illustrated in FIG. 2.
Figure 4:
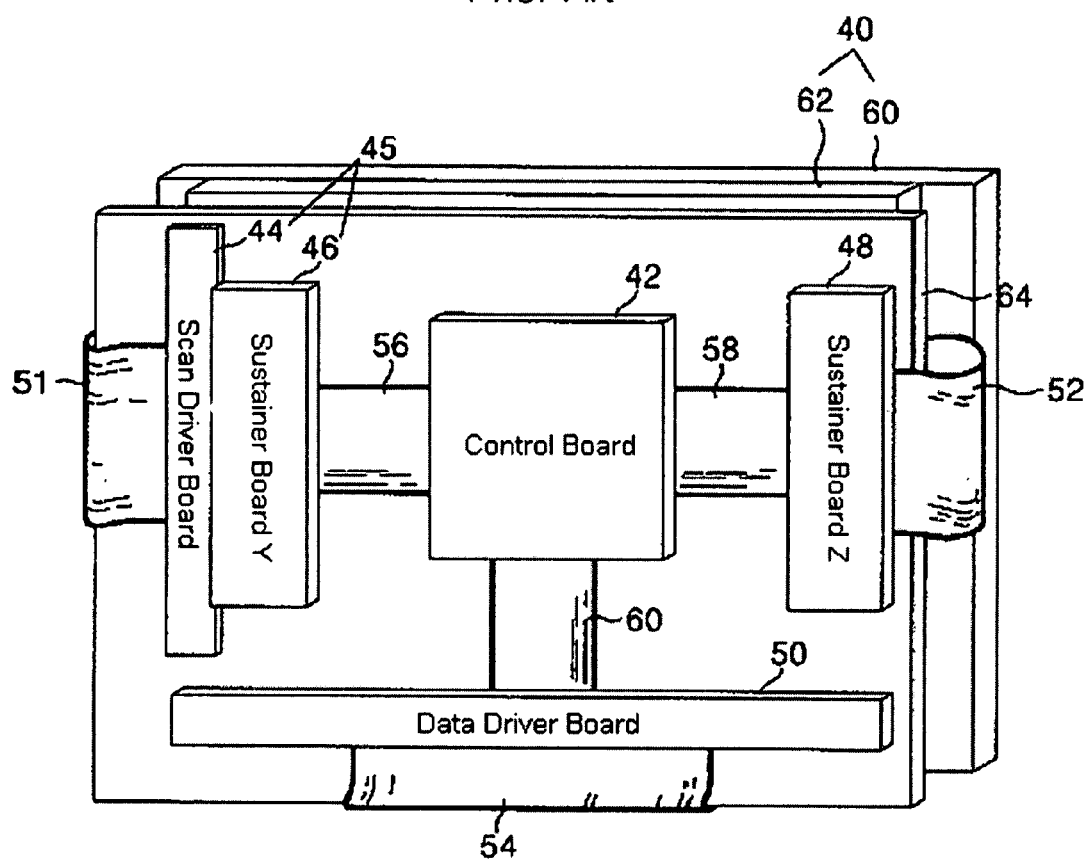
FIG. 4 is a diagram illustrating the backside structure of a conventional plasma display panel module.
Figure 5:
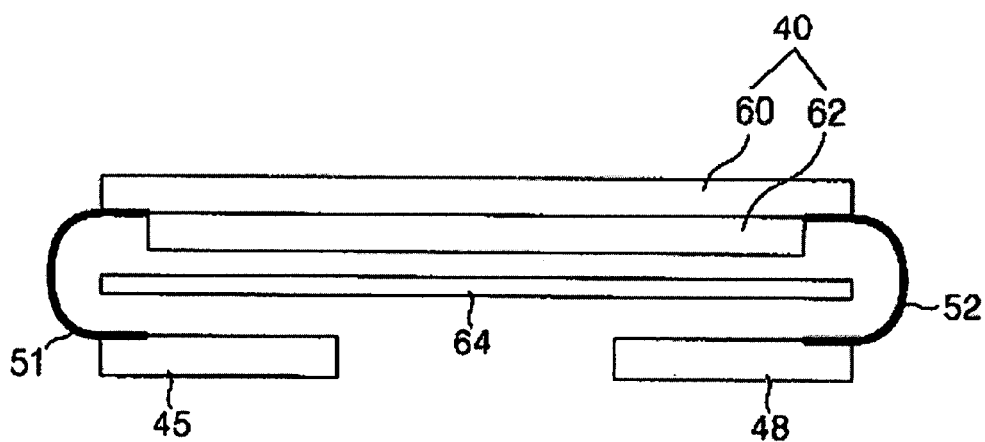
FIG. 5 is a cross-section diagram illustrating a plasma display panel module illustrated in FIG. 4.
Figure 6:
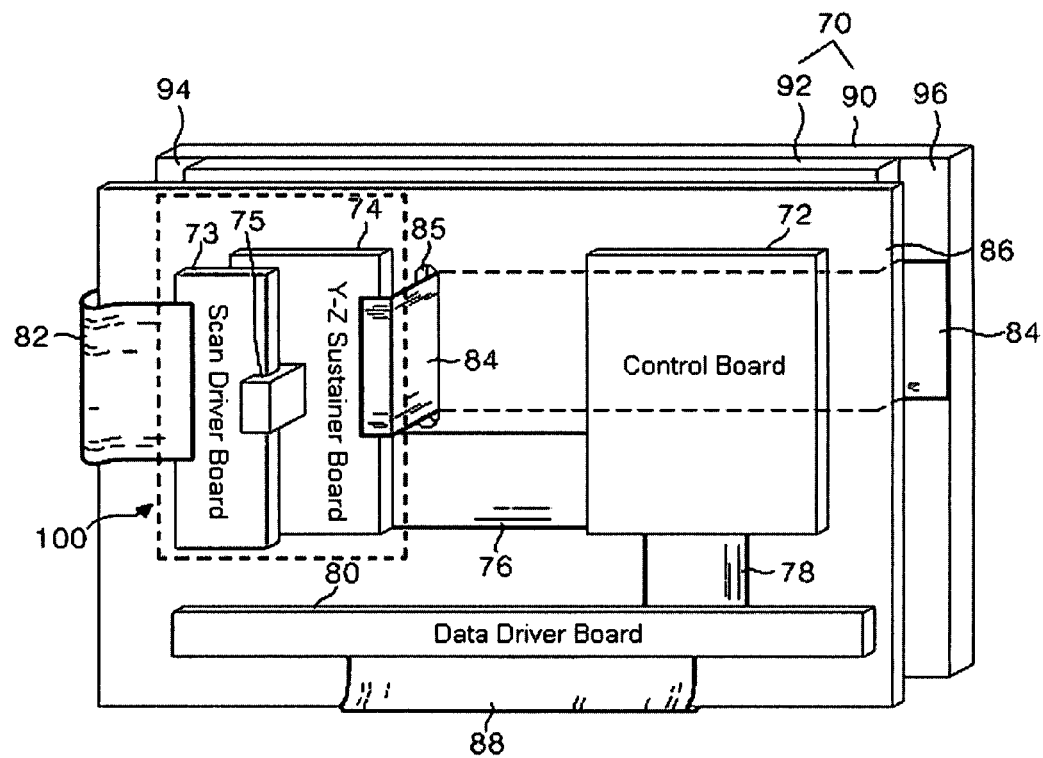
FIG. 6 is a diagram illustrating the backside structure of a plasma display panel module in the embodiment of the present invention.

The data driver board 80 generates the data pulse DP with the timing control signal X from the control board 72, and provides the data pulse with the data electrode lines in the PDP 70 via a FPC X 88, as is shown in FIG. 3. The FPC X 88 is connected to the pad region X (not shown in the diagram) that is installed in the data driver board 80 and the PDP 70.

The Y-Z integration board 100 is comprised of the scan driver board 73, the Y-Z sustainer board 74, and a connector 75 that connects the boards 73 and 74.

With the timing control signal Y from the control board 72, the scan driver board 73 generates the reset pulse RP that is provided with scan electrode lines in the reset period APD as is shown in FIG. 3, and generates the scan pulse SP that is provided in the address period APD. Also, the scan driver board 73 provides the reset pulse RP and the scan pulse SP with the scan electrode lines in the PDP 70 via a FPC Y 82.

Figure 7:
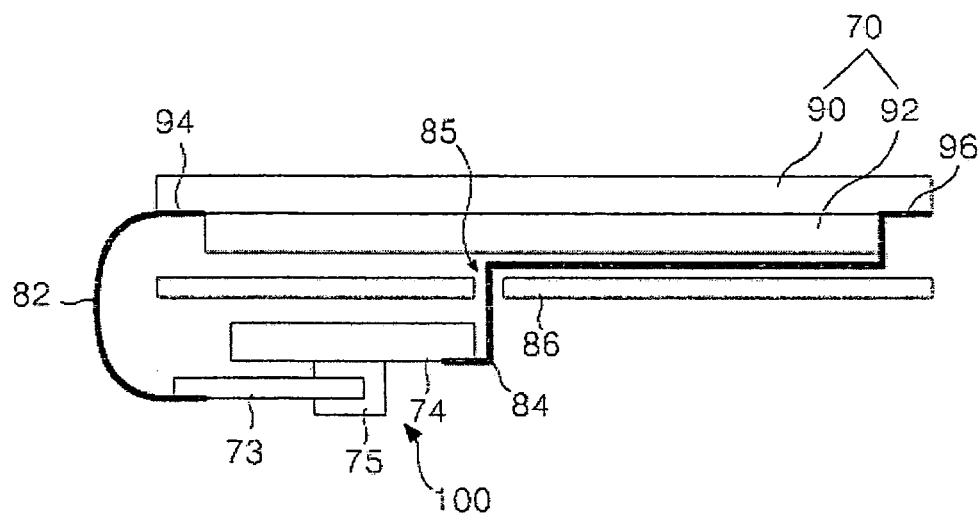
FIG. 7 is a cross-section diagram illustrating a plasma display module illustrated in FIG. 6.

As is shown in FIG. 7, the FPC Y 82 is connected to the scan driver board 73 and the pad region Y 94 in the PDP 70, and is connected to the face or the back of a side of the scan driver board 73.

With timing control signals Y and Z from the control board 72, the Y-Z sustainer board 74 generates the sustain pulse Y SUSPy that is provided with the scan electrode lines in the sustain period SPD, and generates sustain pulse Z SUSPz that is provided with the sustain electrode lines in place of the sustain pulse Y SUSPy.

And, the Y-Z sustainer board 74 generates the bias pulse BP that is provided with the sustain electrode lines in the reset period RTPD and the address period APD, as is shown in FIG. 3.

The Y-Z sustainer board 100 has a sustain circuit Y (not shown in the diagram) that generates the sustain pulse Y SUSPy and the sustain circuit Z (not shown in the diagram) that generates the bias pulse BP and the sustain pulse Z SUSPz.

Figure 8:
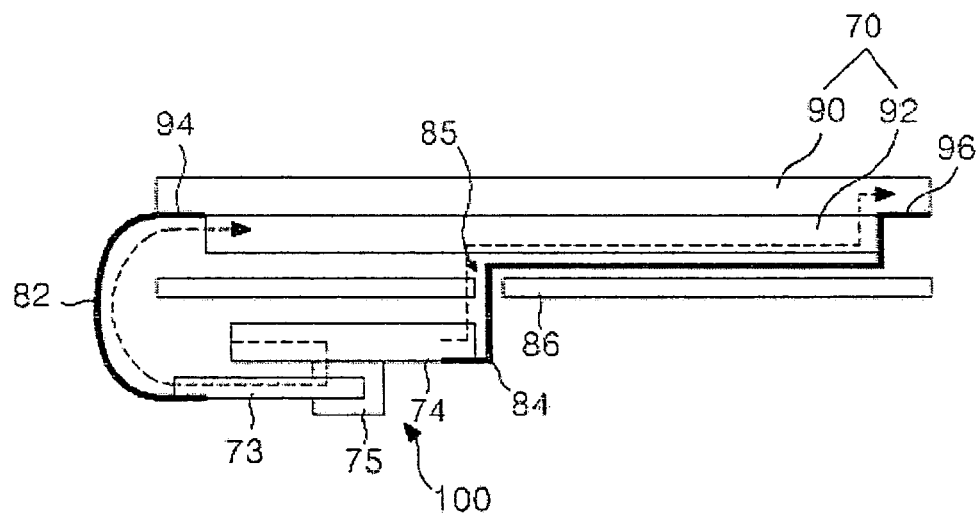
FIG. 8 is a cross-section diagram illustrating a path of an output signal by a Y-Z integration board illustrated in FIG. 7.

As is shown in FIG. 8, the Y-Z sustainer board 74 in this embodiment provides the sustain pulse Y SUSPy with the scan electrode lines in the PDP 70 via the path whose direction is the connector 75, the scan driver board 73, and the FPC Y 82. Also, as is shown in FIG. 8, the Y-Z sustainer board 74 provides the bias pulse BP and the sustain pulse Z SUSPz with the sustain electrode lines in the PDP 70 through the penetration hole 85 formed in the heat sink 86, via the FPC Z 84 that is electrically connected to the sustain circuit Z (not shown in the diagram) in the Y-Z sustainer board 74 and the pad region Z 96 on the upper board 90.

As is shown in FIG. 7, the FPC Z 84 has electrical connection to the Y-Z sustainer board 74, and is connected to the pad region Z 96 that is formed in the PDP 70 via a path between the PDP 70 and the heat sink 86 through the penetration hole 85 formed in the heat sink 86. The FPC Z 86 is connected to the face or back of a side of the Y-Z sustainer board 74.

In this case, the sustain circuits Y and Z are integrated into the Y-Z sustainer board 74, and the heat sink 86 cannot play a part as an electrical current path. This makes it possible to decrease electromagnetic interference in the PDP 70.

In the concrete, when the Y-Z sustainer board 74 provides the sustain pulse Y SUSPy with the scan electrode lines, the first electric current path follows the direction of: the Y-Z sustainer board 74, the connector, the scan driver board 73, the FPC Y 82, the scan electrode lines, the panel capacitor, the sustain electrode lines, the FPC Z 84, the Y-Z sustainer board 74.

On the other hand, the second electric current path, which the Y-Z sustainer board 74 provides the sustain pulse Z SUSPz with the sustain electrode lines in the PDP 70, follows the direction of: the Y-Z sustainer board 74, the FPC Z 84, the sustain electrode lines, the panel capacitor, the scan electrode lines, the FPC Y 82, the scan driver board 73, the connector 75, and the Y-Z sustainer board 74.

In this case, the FPC Z 84 is connected to the pad region Z 96 via a path between the PDP 70 and the heat sink 86 through the penetration hale 85 formed in the heat sink 86, and the heat sink 86 cannot play a role as a electric current path. This makes it possible to decrease the electromagnetic interference in the PDP 70.

As is described above, the sustain circuits Y and Z are integrated into one board in the PDP module related to the embodiment of the present invention. This makes it possible to simplify the structure of the circuit boards.

Especially, in the PDP module related to the embodiment of the present invention, the Y-Z sustainer board, which the sustain circuits Y and Z are integrated into, is located in one side of the heat sink, and the heat sink cannot play a part as a electric current path. Therefore, this makes it possible to decrease the electromagnetic interference in the PDP.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A plasma display panel module comprising:
    a plasma display panel that has scan electrode lines, sustain electrode lines, and data electrode lines;
    an integration board that drives said scan electrode lines and said sustain electrode lines;
    a first electric current path that is connected between said integration board and said scan electrode lines;
    a control board that provides control signals to said integration board; and a metal plate with a penetration hole displaced between an area of the metal plate on which said integration board is positioned and an area of the metal plate on which said control board is positioned, wherein said second electric current path is connected to said integration board and is connected to said sustain electrode lines via said penetration hole and the path between said plasma display panel and said metal plate.

2. The plasma display panel module according to claim 1, wherein said penetration hole is formed closer to said integration board than said control board.

3. The plasma display panel module according to claim 1, wherein said first electric current path and said second electric current path are respectively a first flexible printed circuit and a second flexible printed circuit.

4. The plasma display panel module according to claim 1, wherein said first electric current path is connected to either a face or a back of a side of said integration board.

5. The plasma display panel module according to claim 4, wherein said second electric current path is connected to either the face or the back of the other side of said integration board.

6. The plasma display panel module according to claim 1, wherein said integration board comprises:
    a scan driver board that generates a scan pulse for said scan electrode lines;
    a Y-Z sustainer board that generates a first sustain pulse for said scan electrode lines, and a second sustain pulse for said sustain electrode lines; and
    a connector that connects said scan driver board to said Y-Z sustainer board.

7. The plasma display panel module according to claim 1, further comprising:
    a data driver board that generates a data pulse for said data electrode lines;
    a flexible printed circuit that is connected between said data driver board and said data electrode lines; and
    a power board that supplies power for each of said boards.

8. A plasma display panel module comprising:
    an integration board that drives scan electrodes and sustain electrodes;
    a first electric current path between said integration board and said scan electrodes;
    a second electric current path between said integration board and said sustain electrodes;
    a control board to control signals; and
    a metal plate having a penetration hole, a first area over which said integration board is provided and a second area over which said control board is provided, the penetration hole provided between the first area and the second area, wherein said second electric current oath is coupled to said integration board and is coupled to said sustain electrodes via said penetration hole and a path between a plasma display panel and said metal plate.

9. The plasma display panel module according to claim 8, wherein said penetration hole is adjacent to said integration board.

10. The plasma display panel module according to claim 8, wherein said first electric current path comprises a first flexible printed circuit and the second electric current path comprises a second flexible printed circuit.

11. The plasma display panel module according to claim 8, wherein said first electric current path is coupled to one side of said integration board.

12. The plasma display panel module according to claim 11, wherein said second electric current path is coupled to the other side of said integration board.

13. The plasma display panel module according to claim 8, wherein said integration board comprises:
    a scan driver board to generate a scan pulse to be provided to said scan electrodes;
    an Y-Z sustainer board to generate a first sustain pulse to provided to said scan electrodes and to generate a second sustain pulse to be provided to said sustain electrodes; and
    a connector to couple said scan driver board and said Y-Z sustainer board.

14. The plasma display panel module according to claim 8, further comprising:
    a data driver board to generate a data pulse to be provided to said data electrodes;
    a flexible printed circuit coupled between said data driver board and said data electrodes; and
    a power board to supply power to each of said boards.

15. A plasma display panel module comprising:
    a plasma display panel having scan electrode lines, sustain electrode lines and data electrode lines;
    an integration board to drive the scan electrode lines and the sustain electrode lines;
    a first flexible printed circuit between the integration board and the scan electrode lines;
    a second flexible printed circuit between the integration board and the sustain electrode lines;
    a control board to control signals; and
    a metal plate having a penetration hole, a first area over which the integration board is provided and a second area over which the control board is provided, the penetration hole provided between the first area and the second area, wherein the second flexible printed circuit is coupled to the integration board and is coupled to the sustain electrodes via the penetration hole and a path between a plasma display panel and the metal plate.

16. The plasma display panel module according to claim 15, wherein the integration board comprises:
- a scan driver board to generate a scan pulse for said scan electrode lines;
- an Y-Z sustainer board to generate a first sustain pulse for the scan electrode lines and to generate a second sustain pulse for the sustain electrode lines; and
- a connector to couple the scan driver board and the Y-Z sustainer board.

17. The plasma display panel module according to claim 15, further comprising:
- a data driver board to generate a data pulse for the data electrode lines;
- a flexible printed circuit coupled between the data driver board and the data electrode lines; and
- a power board to supply power to each of the boards.

18. The plasma display panel module according to claim 15, wherein the first flexible printed circuit is coupled to one side of the integration board.

* * * * *